(12) United States Patent
Takenaka et al.

(10) Patent No.: US 8,431,963 B2
(45) Date of Patent: Apr. 30, 2013

(54) FIELD-EFFECT TRANSISTOR

(75) Inventors: Isao Takenaka, Kanagawa (JP);
Kazunori Asano, Kanagawa (JP); Kohji Ishikura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 253 days.

(21) Appl. No.: 12/770,018

(22) Filed: Apr. 29, 2010

(65) Prior Publication Data

US 2010/0295097 A1 Nov. 25, 2010

(30) Foreign Application Priority Data

May 21, 2009 (JP) .................................. 2009-123188

(51) Int. Cl.
*H01L 29/778* (2006.01)
(52) U.S. Cl.
USPC .................... 257/194; 257/196; 257/E29.246
(58) Field of Classification Search .................. 257/194, 257/E29.246, E29.247, E29.248, E29.252, 257/E21.403, E21.407, 196, 200, 199, E51.01, 257/E51.011, E51.014, E51.015; 438/167, 438/172
See application file for complete search history.

(56) References Cited

U.S. PATENT DOCUMENTS

| | | | | |
|---|---|---|---|---|
| 4,727,404 A | * | 2/1988 | Boccon-Gibod | 257/284 |
| 5,430,310 A | * | 7/1995 | Shibasaki et al. | 257/190 |
| 7,400,000 B2 | * | 7/2008 | Otsuka et al. | 257/189 |
| 7,465,967 B2 | * | 12/2008 | Smith et al. | 257/194 |
| 2003/0057106 A1 | * | 3/2003 | Shen et al. | 205/655 |
| 2007/0272957 A1 | | 11/2007 | Johnson et al. | |
| 2010/0065923 A1 | * | 3/2010 | Charles et al. | 257/402 |
| 2010/0109052 A1 | * | 5/2010 | Nakajima et al. | 257/197 |
| 2011/0057232 A1 | * | 3/2011 | Sheppard et al. | 257/194 |

* cited by examiner

*Primary Examiner* — Cuong Q Nguyen
*Assistant Examiner* — Yosef Gebreyesus
(74) *Attorney, Agent, or Firm* — Young & Thompson

(57) ABSTRACT

A field-effect transistor according to the present invention includes a silicon substrate that has a resistivity of not more than 0.02 Ω·cm, a channel layer that is formed on the silicon substrate and has a thickness of at least 5 μm, a barrier layer that is formed on the channel layer and supplies the channel layer with electrons, a two dimensional electron gas layer that is formed by a hetero junction between the channel layer and the barrier layer, a source electrode and a drain electrode that each form an ohmic contact with the barrier layer, and a gate electrode that is formed between the source electrode and the drain electrode, and forms a Schottky barrier junction with the barrier layer.

4 Claims, 5 Drawing Sheets

FIELD-EFFECT TRANSISTOR

INCORPORATION BY REFERENCE

This application is based upon and claims the benefit of priority from Japanese patent application No. 2009-123188, filed on May 21, 2009, the disclosure of which is incorporated herein in its entirety by reference.

BACKGROUND

1. Field of the Invention

The present invention relates to a field-effect transistor, and particularly, to a field-effect transistor for use in a radio-frequency region that is equal to or higher than the microwave band.

2. Description of Related Art

One of the key devices for next generation mobile communication systems (i.e., LTE: Long Term Evolution) that realize large-capacity and high-speed transmission is a transistor used for a power amplifier of a mobile communication base station. Such a transistor is required to possess a high-efficiency characteristic for reducing the size and the power consumption of the device.

One type of such a transistor is a field-effect transistor (FET) in which a nitride semiconductor such as GaN is used. GaN, which is a wide bandgap semiconductor, exhibits high saturated electron velocities and dielectric breakdown voltages. Further, since an AlGaN/GaN hetero junction structure can realize high sheet electron densities, GaN is expected to serve as a material for radio-frequency transistors that achieve high-voltage and high-output operations. The field-effect transistor employing GaN that can achieve high-voltage operations is capable of reducing the impedance transformation circuit loss, and operating highly efficiently.

Recently, what has principally been coming into practical use as the field-effect transistor for the mobile communication base station is a field-effect transistor that has a hetero junction structure, in which a GaN-based material is arranged on a SiC substrate having high thermal conductivity. A semi-insulating SiC substrate is extremely expensive currently and, therefore, cannot meet the needs for reducing costs. Accordingly, in order to achieve a good balance between costs and performances, a GaN-based field-effect transistor using a high-resistivity silicon substrate is also under development.

FIG. 8 shows a field-effect transistor disclosed in United States Patent Application Publication No. 2007/0272957. A field-effect transistor 110 shown in FIG. 8 includes a high-resistivity silicon substrate 120 whose resistivity is equal to or greater than 100 Ω·cm, an AlGaN layer 122, a GaN layer 112a, an $Al_{0.26}Ga_{0.74}N$ layer 112b, a GaN layer 112c, a source electrode 114, a drain electrode 116, a gate electrode 118 that is provided between the source electrode 114 and the drain electrode 116, an SiN film 128, a source field plate 129 formed on the SiN film 128, and a protection film 124. The field-effect transistor in accordance with United States Patent Application Publication No. 2007/0272957 can reduce the RF loss involved with a substrate by using the high-resistivity silicon substrate, and can also reduce manufacturing costs by dispensing with an expensive semi-insulating SiC substrate.

SUMMARY

FIG. 5A shows a field-effect transistor. The field-effect transistor shown in FIG. 5A includes a silicon substrate 1, a channel layer 2, a two dimensional electron gas (2DEG) layer 3, a barrier layer 4, a source electrode 5, a drain electrode 6, a gate electrode 7, a source field plate 10, and a protection film 8. In the field-effect transistor shown in FIG. 5A, a loss occurs due to the presence of a resistance Rdp and a capacitance Cdp between drain and source, as shown in FIG. 5B. FIG. 5C shows the relationship between the resistivity of the substrate of the field-effect transistor shown in FIG. 5A and the loss due to drain-source parasitic resistance. As shown in FIG. 5C, the greater the value of Cdp, the greater the loss of the field-effect transistor. It can also be seen that the loss is greater when the resistivity Rdp of the silicon substrate falls within a range of 0.1 to 100 (Ω·cm). The field-effect transistor in accordance with United States Patent Application Publication No. 2007/0272957 employs a high-resistivity silicon substrate (that is, a substrate with a great Rdp value) and, therefore, the field-effect transistor can reduce the loss thereof.

FIG. 6 shows the relationship between the temperature of silicon substrates and the resistivity. As shown in FIG. 6, as to a high-resistivity silicon substrate (for example, Si whose doping concentration is $10^{14}$ cm$^{-3}$), the resistivity (ρ) thereof greatly varies as the temperature of the silicon substrate increases. In particular, the resistivity rapidly reduces when the temperature of the silicon substrate exceeds 200° C.

Hence, when a field-effect transistor is structured using a high-resistivity silicon substrate, in a manner that can be seen in the field-effect transistor disclosed in United States Patent Application Publication No. 2007/0272957, a temperature of the silicon substrate exceeding 200° C. rapidly reduces the resistivity of the silicon substrate. In this case, as shown in FIG. 5C, resistivity Rdp of the silicon substrate falls within a range of 0.1 to 100 (Ω·cm), resulting in an increase in a loss due to the drain-source parasitic resistance and a great reduction in the efficiency of the field-effect transistor. Accordingly, it has now been discovered that, employing a high-resistivity silicon substrate in a manner that can be seen in the field-effect transistor in accordance with United States Patent Application Publication No. 2007/0272957, a field-effect transistor that can operate highly efficiently over a wide temperature range cannot be obtained.

A first exemplary aspect of the present invention is a field-effect transistor which includes a silicon substrate that has a resistivity of not more than 0.02 Ω·cm, a channel layer that is formed on the silicon substrate and has a thickness of at least 5 μm, a barrier layer that is formed on the channel layer and supplies the channel layer with electrons, a two dimensional electron gas layer that is formed by a hetero junction between the channel layer and the barrier layer, a source electrode and a drain electrode that each form an ohmic contact with the barrier layer, and a gate electrode that is formed between the source electrode and the drain electrode, and forms a Schottky barrier junction with the barrier layer.

A second exemplary aspect of the present invention is a field-effect transistor which includes a silicon substrate that has a resistivity of not more than 0.02 Ω·cm, a channel layer that is formed on the silicon substrate and has a thickness of at least 5 μm, a barrier layer that is formed on the channel layer and supplies the channel layer with electrons, a two dimensional electron gas layer that is formed by a hetero junction between the channel layer and the barrier layer, a cap layer that is formed on the barrier layer, a source electrode and a drain electrode that each form an ohmic contact with the cap layer, and a gate electrode that is formed between the source electrode and the drain electrode, and form a Schottky barrier junction with the cap layer.

A field-effect transistor in accordance with the present invention employs a silicon substrate whose resistivity is equal to or smaller than 0.02 Ω·cm. Hence, even when the temperature of the silicon substrate exceeds 200° C., the resistivity of the silicon substrate does not rapidly decrease.

Accordingly, the present invention can provide a field-effect transistor that can operate highly efficiently over a wide temperature range. Furthermore, since the field-effect transistor in accordance with the present invention defines the thickness of a channel layer to be equal to or greater than 5 μm, the capacitance value Cdp occurring between drain and source can be reduced. Thus, the efficiency of the field-effect transistor can be improved.

In accordance with the present invention, a field-effect transistor that can operate highly efficiently over a wide temperature range can be provided.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

Figure 1:
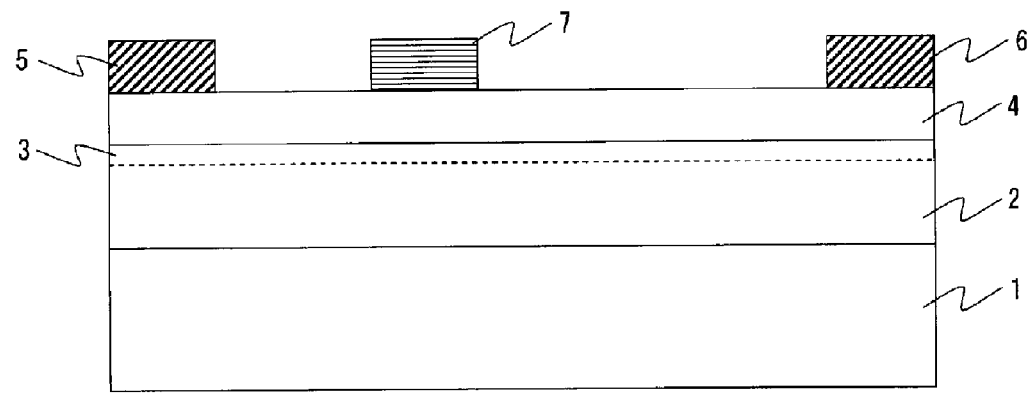
FIG. 1 is a cross-sectional view of a field-effect transistor in accordance with a first exemplary embodiment.

Hereinafter, exemplary embodiments of the present invention are explained, referring to the drawings.

FIG. 1 is a cross-sectional view of a field-effect transistor in accordance with a present exemplary embodiment. As shown in FIG. 1, the field-effect transistor in accordance with the present exemplary embodiment includes a silicon substrate 1, a channel layer 2 that is formed on the silicon substrate 1 and that has a thickness of equal to or greater than 5 μm, a barrier layer 4 that is formed on the channel layer 2 and that supplies the channel layer 2 with electrons, a two dimensional electron gas (2DEG) layer 3 that is formed by a hetero junction between the channel layer 2 and the barrier layer 4, a source electrode 5 and a drain electrode 6 that each form an ohmic contact with the barrier layer 4, and a gate electrode 7 that is formed between the source electrode 5 and the drain electrode 6 and that forms a Schottky barrier junction with the barrier layer 4.

The silicon substrate 1 is a substrate whose resistivity is equal to or greater than 0.001 Ω·cm and equal to or smaller than 0.02 Ω·cm. As the channel layer 2 formed on the silicon substrate 1, i-GaN may be used, for example. Note that the channel layer 2 not necessarily include i-GaN only, and it may include i-Al(Ga)N, i-In(Ga)N and the like, so as to be a multilayered structure. The thickness of the channel layer 2 should be equal to or greater than 5 μm and equal to or smaller than 10 μm, for example. Note that, on condition that the wafer warpage that emerges as a problem in the device manufacturing process can be controlled, the upper limit of the thickness can be raised. In addition, the thickness of the channel layer 2 should be a value at which the parasitic capacitance Cdp (see FIG. 5A) occurring between drain and source of the field-effect transistor can be reduced. As the barrier layer 4 formed on the channel layer 2, i-$Al_xGa_{1-x}N$ (x=0.1 to 0.3) may be used, for example. The thickness of the barrier layer 4 may be 15 to 35 nm, for example. The barrier layer 4 supplies the channel layer 2 with electrons. By the hetero junction between the channel layer 2 and the barrier layer 4, the two dimensional electron gas (2DEG) layer 3 is formed at the interface between the channel layer 2 and the barrier layer 4. The channel layer 2 and the barrier layer 4 are epitaxially grown on the silicon substrate 1.

On the barrier layer 4, the source electrode 5 and the drain electrode 6 that each form an ohmic contact with the barrier layer 4 are formed. The electrons flow from the source electrode 5 to the drain electrode 6 via the two dimensional electron gas layer 3. The source electrode 5 and the drain electrode 6 can be formed by, for example, Ti/Al, Ti/Pt/Au and the like. Between the source electrode 5 and the drain electrode 6 that are located on the barrier layer 4, the gate electrode 7 that forms a Schottky barrier junction with the barrier layer 4 is formed. The gate electrode 7 can be formed using NiAu, for example.

Note that the materials and the thickness values for structuring the field-effect transistor in accordance with the present exemplary embodiment referred to in the foregoing explanation are merely exemplary materials and values, and they may be changed as appropriate in so far as being capable of structuring a hetero junction field-effect transistor (HJFET).

The field-effect transistor in accordance with the present exemplary embodiment employs a silicon substrate whose resistivity is equal to or smaller than 0.02 Ω·cm. Hence, even when the temperature of the silicon substrate exceeds 200° C., the resistivity of the silicon substrate does not rapidly reduce. Accordingly, the present invention can provide a field-effect transistor that can operate highly efficiently over a wide temperature range. Furthermore, since the field-effect transistor in accordance with the present exemplary embodiment defines the thickness of a channel layer to be equal to or greater than 5 μm, the capacitance value Cdp occurring between drain and source can be reduced, whereby the efficiency of the field-effect transistor can be improved.

[Second Exemplary Embodiment]

Next, a field-effect transistor in accordance with a second exemplary embodiment is explained.

Figure 2:
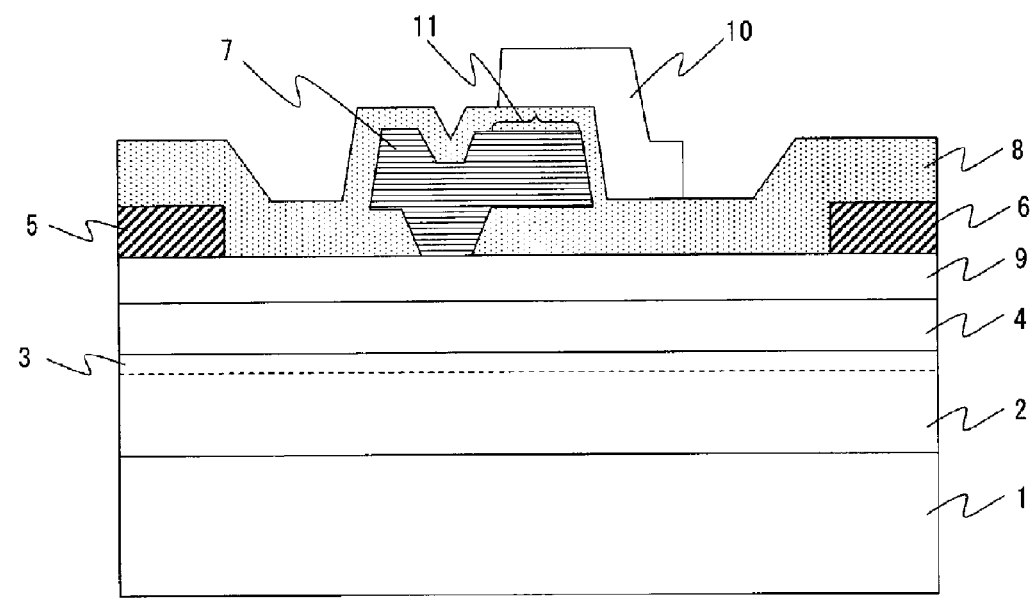
FIG. 2 is a cross-sectional view of a field-effect transistor in accordance with a second exemplary embodiment.

FIG. 2 is an illustration for describing the field-effect transistor in accordance with the second exemplary embodiment. As shown in FIG. 2, the field-effect transistor in accordance with the present exemplary embodiment includes a silicon substrate 1, a channel layer 2 that is formed on the silicon substrate 1, a barrier layer 4 that is formed on the channel layer 2 and supplies the channel layer 2 with electrons, a two dimensional electron gas (2DEG) layer 3 that is formed by a hetero junction between the channel layer 2 and the barrier layer 4, a cap layer 9 that is formed on the barrier layer 4, a source electrode 5 and a drain electrode 6 that each form an ohmic contact with the cap layer 9, a gate electrode 7 that is formed between the source electrode 5 and the drain electrode 6 and that has a gate field plate electrode 11 that forms a Schottky barrier junction with the cap layer 9, a protection film 8, and a source field plate electrode 10 that is formed on the protection film 8.

The silicon substrate 1 is a substrate whose resistivity is equal to or greater than 0.001 Ω·cm and equal to or smaller than 0.02 Ω·cm. As the channel layer 2 formed on the silicon substrate 1, i-GaN may be used, for example. Note that the channel layer 2 not necessarily include i-GaN only, and it may include i-Al(Ga)N, i-In(Ga)N and the like, so as to be a multilayered structure. The thickness of the channel layer 2 should be equal to or greater than 5 μm and equal to or smaller than 10 μm, for example. Note that, on condition that the wafer warpage that emerges as a problem in the device manufacturing process can be controlled, the upper limit of the thickness can be raised. In addition, the thickness of the channel layer 2 should be a value at which the parasitic capacitance Cdp (see FIG. 5A) occurring between drain and source of the field-effect transistor can be reduced. As the barrier layer 4 formed on the channel layer 2, i-$Al_xGa_{1-x}N$ (x=0.1 to 0.3) may be used, for example. The thickness of the barrier layer 4 may be 15 to 35 nm, for example. The barrier layer 4 supplies the channel layer 2 with electrons. By the hetero junction between the channel layer 2 and the barrier layer 4, the two dimensional electron gas layer (2DEG) 3 is formed at the interface between the channel layer 2 and the barrier layer 4. As the cap layer 9 formed on the barrier layer 4, i-GaN may be used, for example. The channel layer 2, the barrier layer 4, and the cap layer 9 are epitaxially grown on the silicon substrate 1.

On the cap layer 9, the source electrode 5 and the drain electrode 6 that each form an ohmic contact with the cap layer 9 are formed. The electrons flow from the source electrode 5 to the drain electrode 6 via the two dimensional electron gas layer 3. The source electrode 5 and the drain electrode 6 can be formed by, for example, Ti/Al, Ti/Pt/Au and the like.

Between the source electrode 5 and the drain electrode 6 that are located on the cap layer 9, the gate electrode 7 that forms a Schottky barrier junction with the cap layer 9 is formed. At the gate electrode 7, the gate field plate electrode 11 that extends toward the drain electrode 6 is formed. The gate field plate electrode 11 is formed on the protection film 8 so as to be integral with the gate electrode 7. The gate electrode 7 can be formed using NiAu, for example. By providing the gate field plate electrode 11, it becomes possible to suppress the electric field concentration occurring at the peripheral portion of a depletion layer at the location around the drain side of the gate.

At part of the portion on the protection film 8 between the source electrode 5 and the drain electrode 6, the source field plate electrode 10 is formed so as to cover the part of the gate electrode 7 situated toward the drain electrode 6. By providing the source field plate electrode 10, it becomes possible to suppress the electric field concentration occurring at the peripheral portion of the depletion layer at the location around the drain side of the gate. As the protection film 8, SiN can be used, for example.

Note that the materials and the thickness values for structuring the field-effect transistor in accordance with the present exemplary embodiment referred to in the foregoing explanation are merely exemplary materials and values, and they may be changed as appropriate in so far as being capable of structuring a hetero junction field-effect transistor (HJFET).

Figure 3:
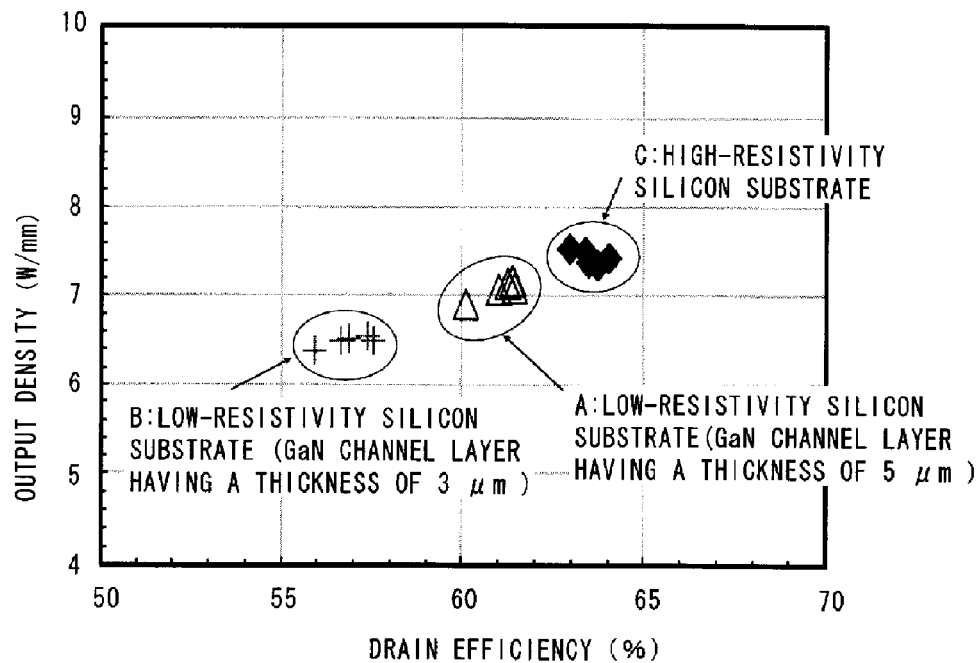
FIG. 3 is a relationship between a drain efficiency and an output density of a field-effect transistor in accordance with a second exemplary embodiment.

FIG. 3 shows the relationship between the drain efficiency and the output density of the field-effect transistor in accordance with the present exemplary embodiment. The evaluated field-effect transistors each have a gate width of 0.8 mm (finger length 400 μm×2 pieces), its bias conditions being drain voltage=50 V and drain current=8 mA, and its frequency being 2 GHz (the same hold true for the case shown in FIG. 4). In FIG. 3, Sample A (an invention in accordance with the present exemplary embodiment) is a field-effect transistor that employs a low-resistivity silicon substrate (i.e., a substrate whose resistivity is equal to or smaller than 0.02 Ω·m) as its substrate, and that has a channel layer 2 having a thickness of 5 μm and being formed by GaN. Sample B (a comparative example) is a field-effect transistor that employs a low-resistivity silicon substrate (i.e., a substrate whose resistivity is equal to or smaller than 0.02 Ω·cm) as its substrate, and that has a channel layer 2 having a thickness of 3 μm and being formed by GaN. Sample C (a comparative example) is a conventional field-effect transistor that employs a high-resistivity silicon substrate.

As shown in FIG. 3, Sample A employing the low-resistivity silicon substrate can achieve the drain efficiency and the output density that are equivalent to those of Sample C being a conventional field-effect transistor. Comparing Sample A and Sample B each employing the low-resistivity silicon substrate, it can be seen that Sample A in which thickness of GaN being the channel layer is 5 μm is superior to Sample B in which thickness of GaN is 3 μm, in terms of the drain efficiency and the output density.

Figure 4:
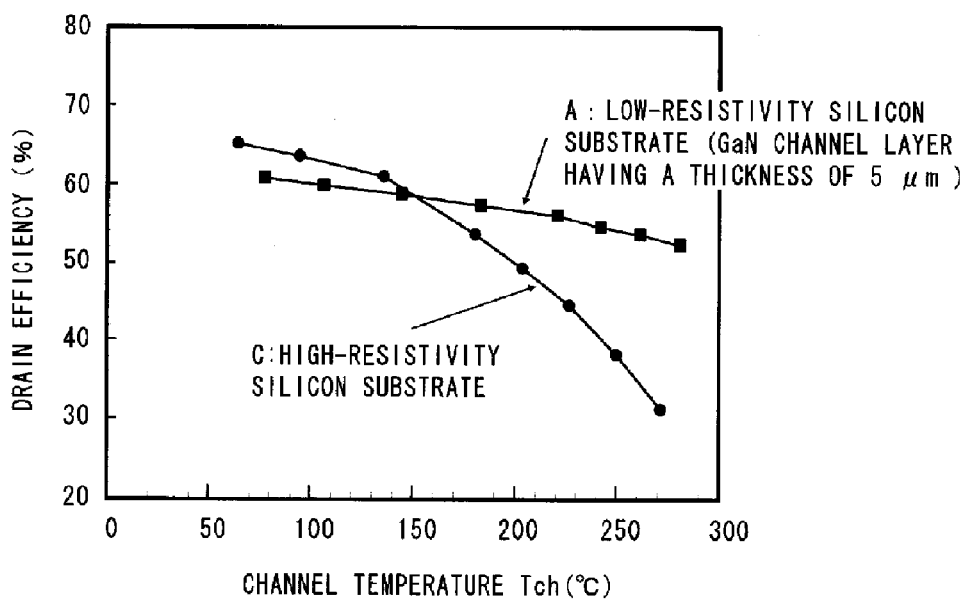
FIG. 4 is a relationship between a channel temperature (Tch) and a drain efficiency of the field-effect transistor in accordance with a second exemplary embodiment.

FIG. 4 shows the relationship between the channel temperature (Tch) and the drain efficiency of the field-effect transistors. Here, the channel temperature corresponds to the silicon substrate temperature. In FIG. 4, Sample A (an invention in accordance with the present exemplary embodiment) is a field-effect transistor that employs a low-resistivity silicon substrate (i.e., a substrate whose resistivity is equal to or smaller than 0.02 Ω·m) as its substrate, and that has a channel layer 2 having a thickness of 5 μm and being formed by GaN. Sample C (a comparative example) is a conventional field-effect transistor that employs a high-resistivity silicon substrate.

As shown in FIG. 4, with Sample C employing the high-resistivity silicon substrate, the drain efficiency rapidly reduces as the channel temperature increases. Specifically, while the drain efficiency is approximately 64% around 100° C., it falls to 30% around 270° C., showing a rapid reduction in the drain efficiency. In contrast, with Sample A employing the low-resistivity silicon substrate, the drain efficiency only reduces by approximately 10% even when the channel temperature increases. Hence, with the field-effect transistor in accordance with the present exemplary embodiment (Sample A), the drain efficiency under high temperatures is drastically improved.

Figure 6:
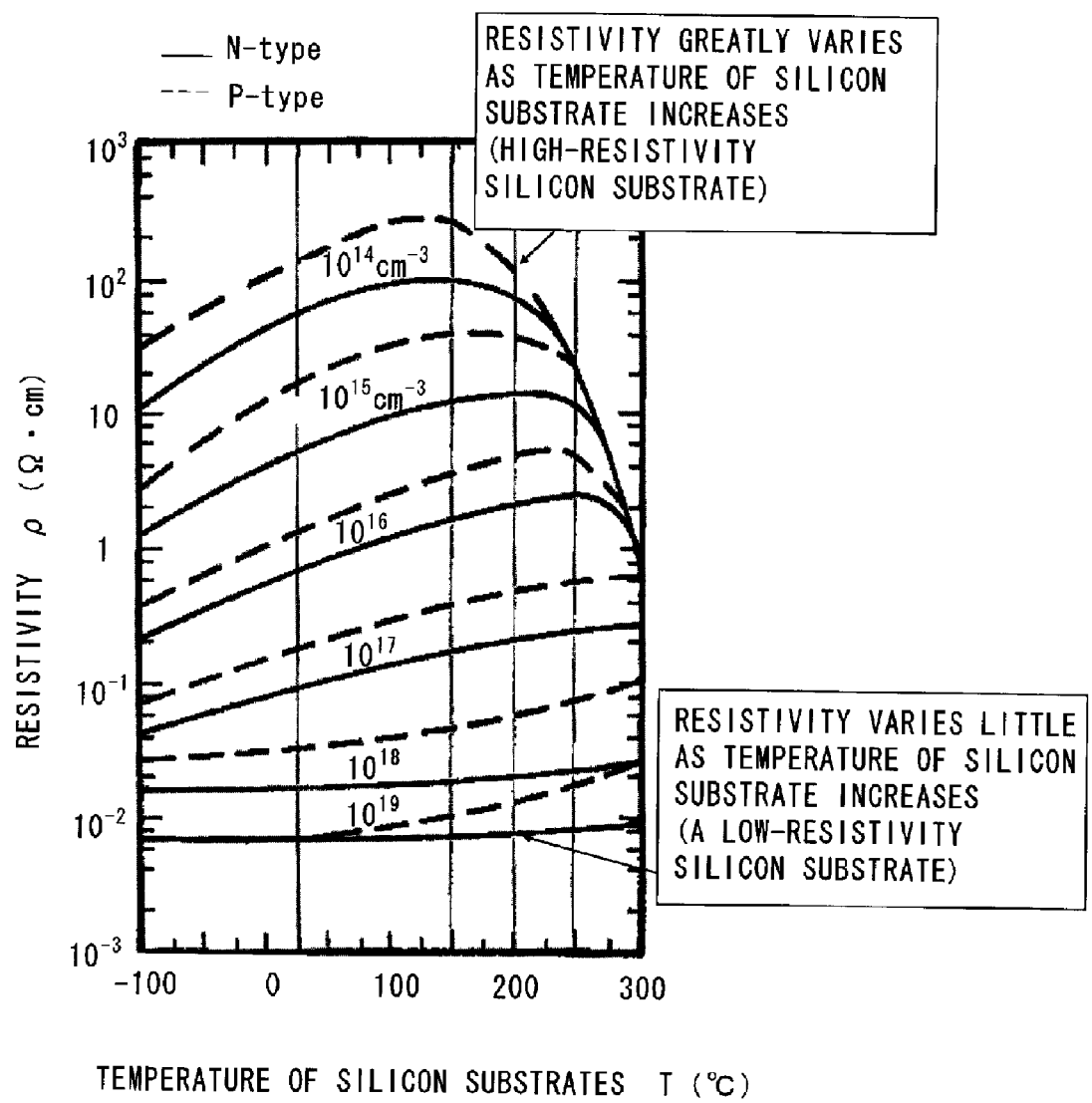
FIG. 6 is a relationship between the temperature of silicon substrates and a resistivity.

That is, as shown in FIG. 6, the resistivity variations of silicon under high temperatures are great with the substrate in which the resistivity of silicon is high, and low with the substrate in which the resistivity of silicon is low. Accordingly, the field-effect transistor in accordance with the present exemplary embodiment employs a low-resistivity silicon substrate having an extremely low resistivity that is equal to or smaller than 0.02 Ω·cm, thereby making it possible to reduce the effect of variations in the resistivity of the substrate on the characteristics of the field-effect transistor.

Figure 5A:
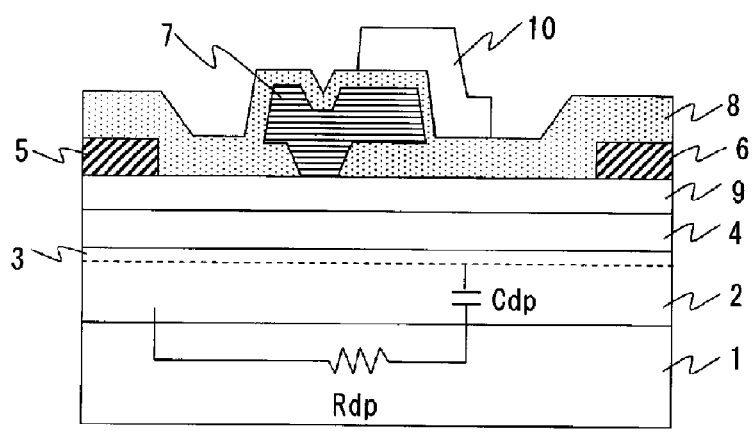
FIG. 5A is a cross-sectional view of a field-effect transistor in accordance with a second exemplary embodiment.
Figure 5B:
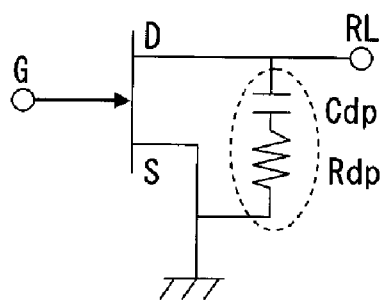
FIG. 5B is an equivalent circuit of a field-effect transistor in accordance with a second exemplary embodiment.
Figure 5C:
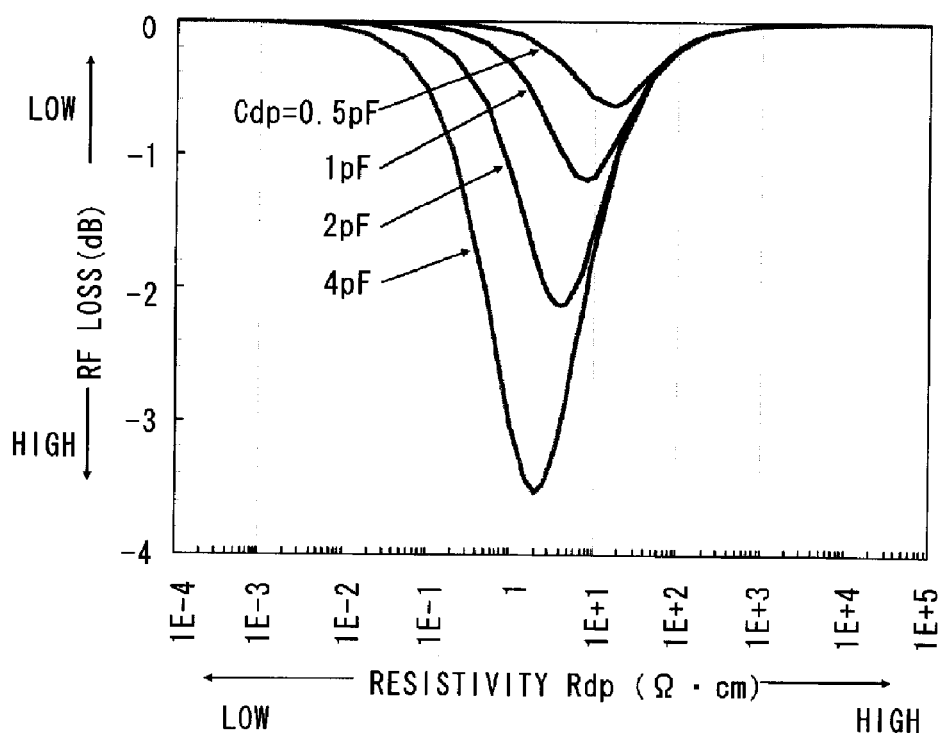
FIG. 5C is a relationship between a resistivity Rdp and an RF loss of a field-effect transistor in accordance with a second exemplary embodiment.

In the field-effect transistor in accordance with the present exemplary embodiment, as shown in FIG. 5A, the RF loss occurs due to coupling between the resistance Rdp of the substrate 1 and the parasitic capacitance Cdp of the channel layer 2. In other words, as shown in FIG. 5B, the loss occurs due to the presence of the resistance Rdp and the capacitance Cdp between drain and source. FIG. 5C shows the relationship between the resistivity Rdp and the RF loss. As shown in FIG. 5C, the smaller the value of the parasitic capacitance Cdp, the smaller the RF loss. Hence, the field-effect transistor in accordance with the present exemplary embodiment defines the thickness of the channel layer 2 to be equal to or greater than 5 μm, thereby reducing the value of the parasitic capacitance Cdp. This makes it possible to reduce the RF loss of the field-effect transistor.

As has been explained in the foregoing, the field-effect transistor in accordance with the present exemplary embodiment employs a low-resistivity silicon substrate as its substrate and, furthermore, defines the thickness of the channel layer 2 to be equal to or greater than 5 μm, thereby making it possible to suppress a reduction in the drain efficiency of the field-effect transistor under high temperatures, while maintaining the drain efficiency being substantially equivalent to that of a conventional field-effect transistor. In particular, this effect is exhibited more significantly when the field-effect transistor in accordance with the present exemplary embodiment is used in the radio-frequency region that is equal to or higher than the microwave band.

[Third Exemplary Embodiment]

Next, a microwave power amplifier in accordance with a third exemplary embodiment is explained.

Figure 7:
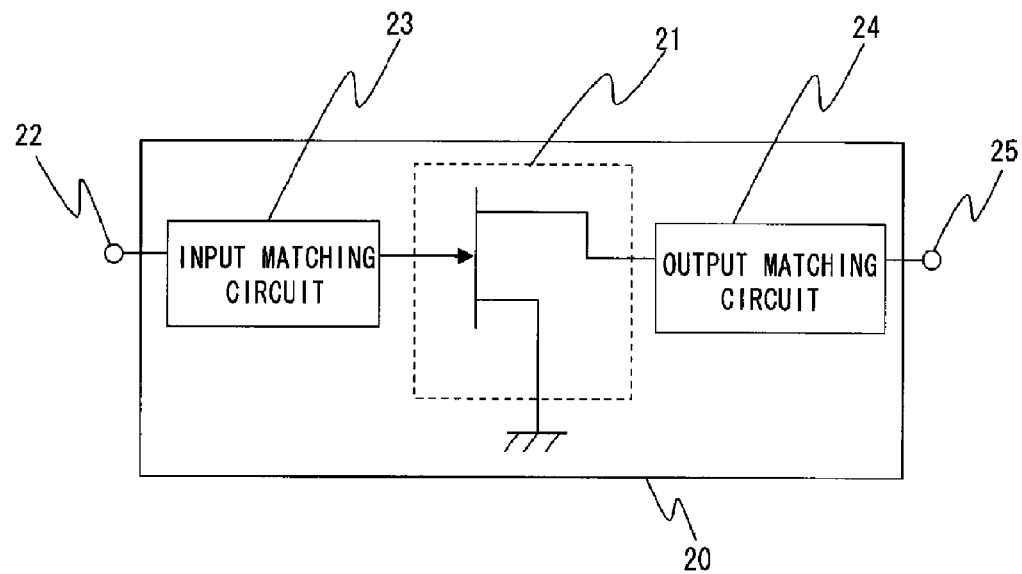
FIG. 7 is a microwave power amplifier that is structured using the field-effect transistor in accordance with a present invention.
Figure 8:
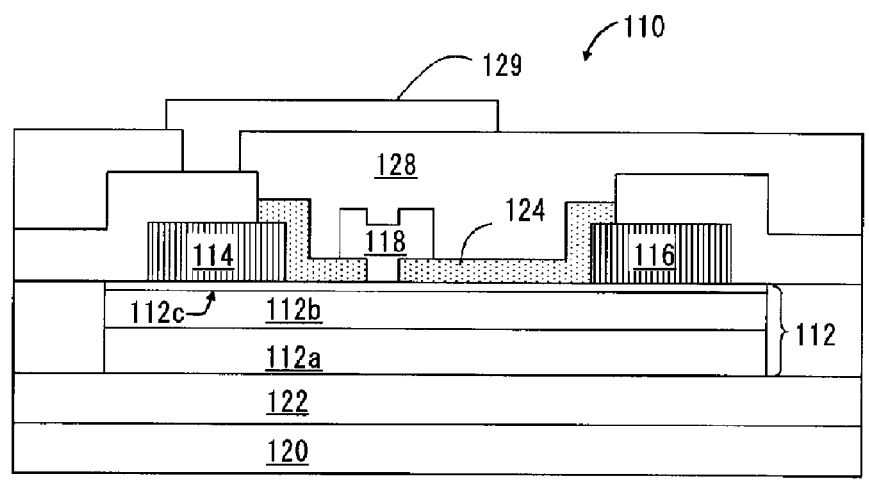
FIG. 8 is a field-effect transistor disclosed in United States Patent Application Publication No. 2007/0272957.

FIG. 7 shows a microwave power amplifier that is structured using the field-effect transistor in accordance with the present invention. A microwave power amplifier 20 in accordance with the present exemplary embodiment includes an input matching circuit 23 whose one end is connected to an input terminal 22 and whose other end is connected to the gate terminal of the field-effect transistor 21, an output matching circuit 24 whose one end is connected to an output terminal 25 and whose other end is connected to the drain terminal of the field-effect transistor 21, and a field-effect transistor 21 whose source terminal is grounded. A package of the microwave power amplifier 20 in accordance with the present exemplary embodiment has a heat dissipation plate (heatsink). By grounding the heat dissipation plate, the heat generated at the field-effect transistor 21 can be dissipated. Note that, it is also possible to adopt a structure that includes at least one of the input matching circuit 23 and the output matching circuit 24.

The first to third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A field-effect transistor comprising:
a silicon substrate that has a resistivity smaller than 0.02 Ω·cm;
a channel layer that is formed on the silicon substrate and has a thickness of at least 5 μm;
a barrier layer that is formed on the channel layer and supplies the channel layer with electrons;
a two dimensional electron gas layer that is formed by a heterojunction between the channel layer and the barrier layer;
a source electrode and a drain electrode that each form an ohmic contact with the barrier layer; and
a gate electrode that is formed between the source electrode and the drain electrode, and forms a Schottky barrier junction with the barrier layer.

2. The field-effect transistor according to claim 1, wherein the resistivity of the silicon substrate is at least 0.001 Ω·cm and smaller than 0.02 Ω·cm.

3. The field-effect transistor according to claim 1, wherein the thickness of the channel layer is at least 5 μm and not more than 10 μm.

4. The field-effect transistor according to claim 1, wherein the channel layer is formed by i-GaN, and the barrier layer is formed by i-$Al_xGa_{1-x}N$ (x=0.1 to 0.3).

* * * * *